United States Patent
Wang

(10) Patent No.: US 10,897,829 B2
(45) Date of Patent: Jan. 19, 2021

(54) CASING ASSEMBLY WITH FLASH LENS AND DECORATIVE RING AND TERMINAL

(71) Applicant: GUANGDONG OPPO MOBILE TELECOMMUNICATIONS CORP., LTD., Guangdong (CN)

(72) Inventor: Jiameng Wang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/583,194

(22) Filed: Sep. 25, 2019

(65) Prior Publication Data
US 2020/0196471 A1  Jun. 18, 2020

(30) Foreign Application Priority Data
Dec. 14, 2018  (CN) .................... 2018 2 2110050 U

(51) Int. Cl.
| H05K 1/02 | (2006.01) |
| H05K 5/02 | (2006.01) |
| G06F 1/16 | (2006.01) |
| H04M 1/02 | (2006.01) |
| H04N 5/225 | (2006.01) |

(52) U.S. Cl.
CPC ......... *H05K 5/0239* (2013.01); *G06F 1/1656* (2013.01); *H04M 1/026* (2013.01); *H04N 5/2254* (2013.01)

(58) Field of Classification Search
CPC ... H05K 5/0239; G06F 1/1656; G06F 1/1686; H04M 1/026; H04M 1/185; H04M 1/0264; H04M 1/0283; H04M 1/0202; H04N 5/2254
See application file for complete search history.

(56) References Cited

U.S. PATENT DOCUMENTS

| 9,667,764 B1 | 5/2017 | Kuhl et al. | |
| 10,491,786 B2 * | 11/2019 | Sanford | H04N 5/2252 |
| 2013/0223836 A1 * | 8/2013 | Gibbs | H01Q 9/42 |
| | | | 396/535 |

(Continued)

FOREIGN PATENT DOCUMENTS

| CN | 205356418 | 6/2016 |
| CN | 107566558 | 1/2018 |

(Continued)

OTHER PUBLICATIONS

WIPO, English translation of the ISR and WO for PCT/CN2019/107885, dated Nov. 27, 2019.

(Continued)

*Primary Examiner* — James Wu
(74) *Attorney, Agent, or Firm* — Hodgson Russ LLP

(57) ABSTRACT

The present disclosure relates to a casing assembly and a terminal. The casing assembly includes a casing, a flash lens, and a decorative ring. The casing has an outer surface and an inner surface opposite the outer surface. The casing defines a first through hole. The first through hole extends through the outer surface and the inner surface. The flash lens covers the first through hole. The decorative ring passes through the first through hole and is coupled to the flash lens and the casing. The decorative ring extends out of the outer surface.

18 Claims, 7 Drawing Sheets

(56) References Cited

U.S. PATENT DOCUMENTS

2019/0082083 A1\* 3/2019 Jarvis .................. H04N 5/2254

FOREIGN PATENT DOCUMENTS

| CN | 107608453 | 1/2018 |
|----|-----------|--------|
| CN | 107613047 | 1/2018 |
| CN | 107623173 | 1/2018 |
| CN | 107666564 | 2/2018 |
| CN | 207150679 | 3/2018 |
| CN | 108040445 | 5/2018 |
| CN | 207992872 | 10/2018 |
| EP | 3454541 | 3/2019 |

OTHER PUBLICATIONS

EPO, Office Action for EP Application No. 19198906.0, dated Oct. 28, 2019.

\* cited by examiner

CASING ASSEMBLY WITH FLASH LENS AND DECORATIVE RING AND TERMINAL

CROSS-REFERENCE TO RELATED APPLICATION(S)

This application claims priority to Chinese Patent Application No. 201822110050.1, filed on Dec. 14, 2018, the entire disclosure of which is incorporated herein by reference.

TECHNICAL FIELD

The present disclosure relates to the technical field of terminals, and in particular, to a casing assembly and a terminal.

BACKGROUND

Terminals such as smartphones are generally provided with a rear casing. An appearance of the rear casing may represent an overall appearance of the terminal. Since the rear casing has a large surface area, when in contact with an external object, the rear casing may be easily subject to scratch and abrasion.

SUMMARY

According to a first aspect of the present disclosure, in an implementation, a casing assembly.

The casing assembly includes a casing, a flash lens, and a decorative ring. The casing has an outer surface and an inner surface opposite the outer surface. The casing defines a first through hole. The first through hole extends through the outer surface and the inner surface. The flash lens covers the first through hole. The decorative ring passes through the first through hole and is coupled to the flash lens and the casing. The decorative ring extends out of the outer surface.

According to a second aspect of the present disclosure, in an implementation, a terminal is provided.

The terminal includes a display screen, a casing, a flashlight, a flash lens, and a decorative ring.

The casing has an outer surface and an inner surface opposite the outer surface. The inner surface is a side of the casing facing the display screen. The outer surface is a side of the casing facing away from the display screen. The casing defines a first through hole. The first through hole extends through the outer surface and the inner surface. The flashlight is disposed between the display screen and the casing. The flash lens is disposed adjacent to a side of the flashlight facing the casing. The flash lens covers the first through hole. The decorative ring passes through the first through hole and is coupled to the flash lens and the casing. The decorative ring extends out of the outer surface.

BRIEF DESCRIPTION OF THE DRAWINGS

To describe technical solutions in implementations of the present disclosure more clearly, the following will briefly introduce the accompanying drawings required for the description of the implementations. Obviously, the accompanying drawings described below only show some implementations of the present disclosure, and those skilled in the art can obtain other drawings based on these drawings without paying creative efforts.

DETAILED DESCRIPTION

To facilitate understanding of the present disclosure, the present disclosure will be described more fully hereinafter with reference to the accompanying drawings. Implementations of the present disclosure are given in the accompanying drawings. However, the present disclosure can be implemented in many different forms and is not limited to the implementations described herein. Rather, these implementations are provided for a more thorough understanding of the present disclosure.

"Terminal device" used herein includes, but is not limited to, a device configured to be coupled with other devices via any one or more of the following connection modes and configured to receive and/or transmit communication signals. The following connection modes includes: (1) coupling via wired circuit connection such as a public switched telephone network (PSTN), a digital subscriber line (DSL), a digital cable, or direct cable connection; (2) coupling via a wireless interface such as a cellular network, a wireless local area network (WLAN), a digital television network such as a digital video broadcasting-H (DVB-H) network, a satellite network, or an amplitude modulation-frequency modulation (AM-FM) broad transmitter.

The terminal device configured to communicate via the wireless interface may be referred to as a "terminal". The terminal includes but is not limited to an electronic device described in the following: (1) a satellite phone or a cellular phone; (2) a personal communication system (PCS) terminal capable of combining with a cellular wireless phone, data processing, faxing, and data communication capabilities; (3) a radio phone, a pager, an internet/intranet access, a Web browser, a memo pad, a calendar, and a personal digital assistant (PDA) equipped with a global position system (GPS) receiver; (4) a conventional laptop and/or palmtop receiver; (5) a conventional laptop and/or palmtop radio phone transceiver and the like.

Figure 1:
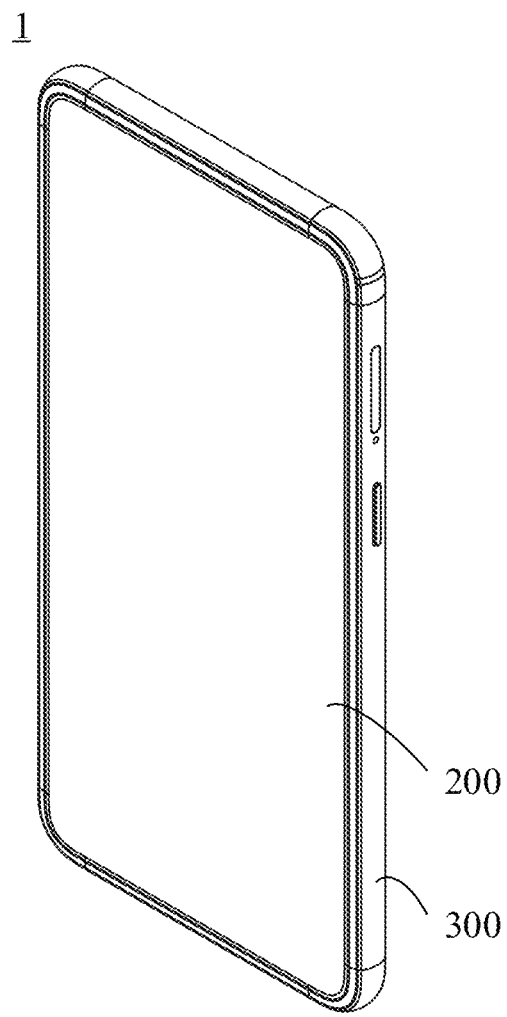
FIG. 1 is a perspective view of a terminal according to an implementation of the present disclosure.
Figure 2:
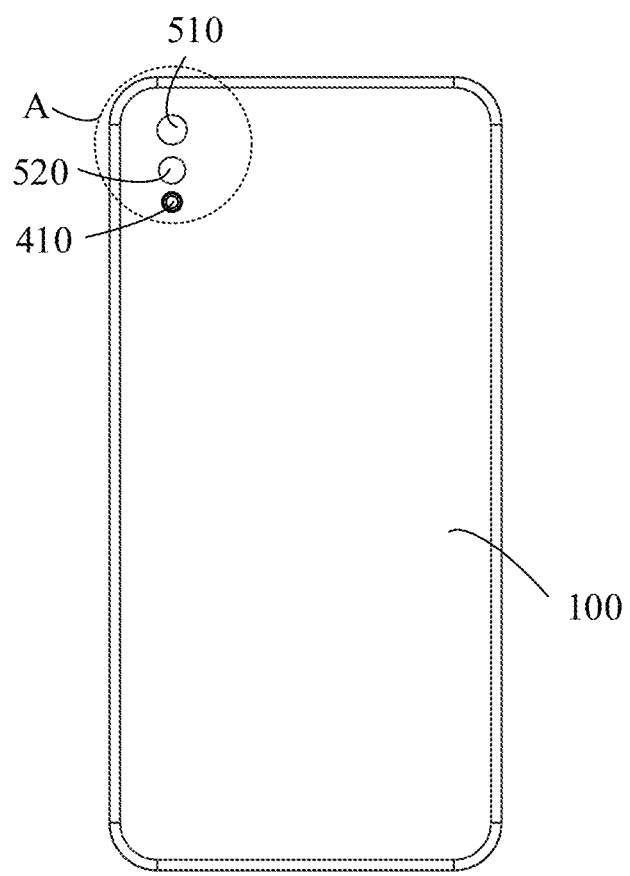
FIG. 2 is a rear view of the terminal illustrated in FIG. 1.
Figure 3:
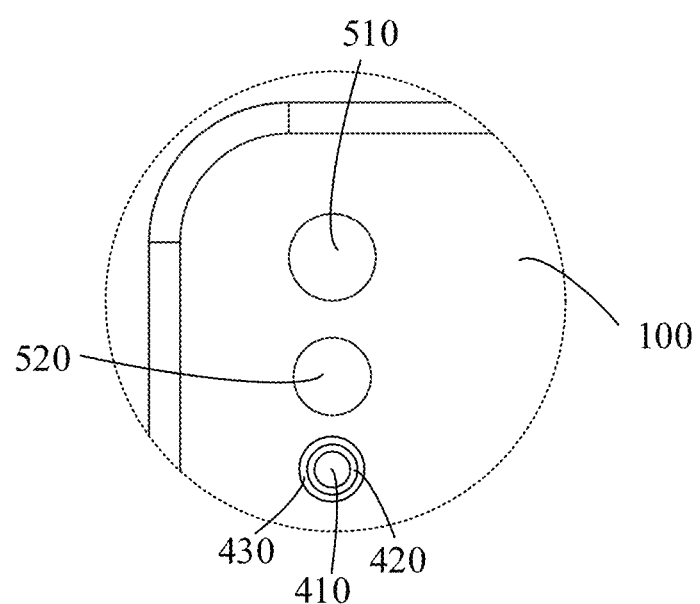
FIG. 3 is an enlarged view of a portion A of the terminal illustrated in FIG. 2.
Figure 4:
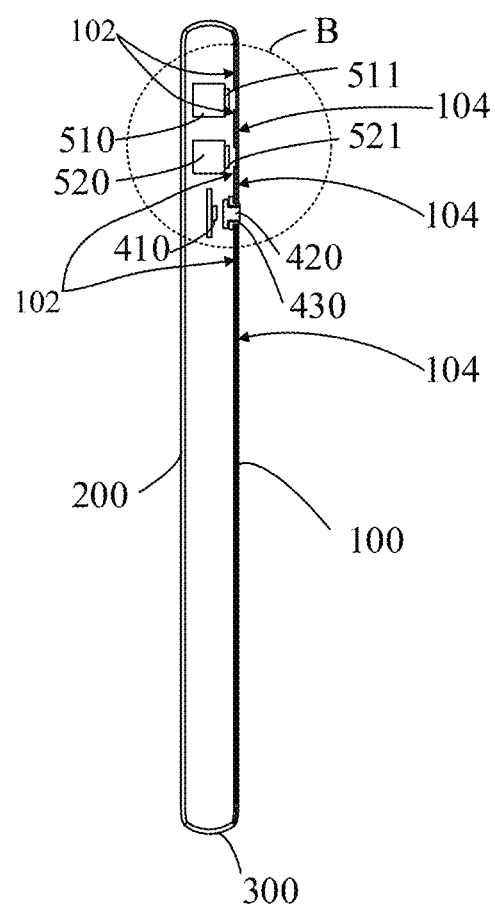
FIG. 4 is a sectional view of the terminal illustrated in FIG. 2.
Figure 5:
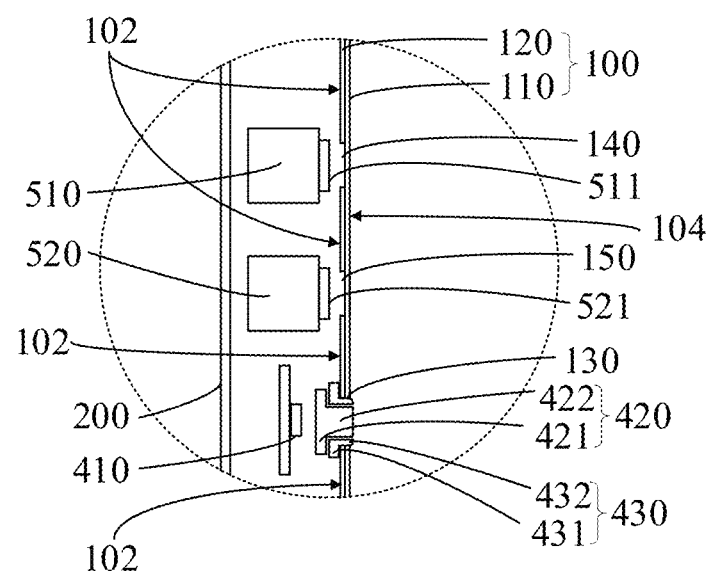
FIG. 5 is an enlarged view of a portion B of the terminal illustrated in FIG. 4.

As illustrated in FIG. 1 and FIG. 2, in an implementation, a terminal 1 is provided. The terminal 1 may be a smartphone, a computer, an iPad, or the like. The terminal 1 includes a display screen 200, a middle frame 300, a casing 100 opposite the display screen 200, and a circuit board. The display screen 200 and the casing 100 are fixed to two opposite sides of the middle frame 300. The display screen 200, the casing 100, and the middle frame 300 constitute an external structure of the terminal 1. The circuit board is disposed in the terminal 1. Electronic components such as a controller, a storage unit, a power management unit, a baseband chip and the like are integrated on the circuit board. The display screen 200 can display pictures or words. The circuit board can control the operation of the terminal 1.

In an example, the display screen 200 includes a liquid crystal display (LCD) for displaying information. The LCD screen may be a thin film transistor (TFT) screen, an in-plane switching (IPS) screen, or a splice liquid crystal display (SLCD) screen. In another example, the display screen 200 includes an organic light-emitting diode (OLED) screen for displaying information. The OLED screen may be an active-matrix organic light-emitting diode (AMOLED) screen, a super active-matrix organic light-emitting diode (Super AMOLED) screen, or a super active-matrix organic light-emitting diode plus (Super AMOLED Plus) screen, and details are not repeated herein.

As illustrated in FIG. 2 to FIG. 5, in an implementation, the terminal 1 includes a first camera assembly 510, a second camera assembly 520, and a flashlight assembly. The first camera assembly 510, the second camera assembly 520, and the flashlight assembly are disposed between the display screen 200 and the casing 100. The first camera assembly 510 has a first incident face 511. The second camera assembly 520 has a second incident face 521. Outer light can pass through the first incident face 511 and the second incident face 521. In an example, the first camera assembly 510 is a telephoto camera, and the second camera assembly 520 is a wide-angle camera, so that a large scene can be captured and an image captured is of high pixel, good definition, and good blurring effect. In another example, the first camera assembly 510 is a color camera, and the second camera assembly 520 is a black-and-white camera, so that an image captured is of higher definition than an image captured by a normal color camera, and this enhancement in definition is particularly significant in night shoot. The flashlight assembly includes a flashlight 410. The flashlight 410 can emit strong light for a short time. The flashlight 410 is a photo-sensitive photographic accessory. The flashlight 410 is mainly used for instant illumination in a low-light scene, and is also used to provide supplemental light for part of an object in a bright-light scene. The light emitted from the flashlight 410 can reach the surroundings of the terminal 1.

As illustrated in FIG. 2 to FIG. 5, in an implementation, the casing 100 includes an inner casing 120 and an outer casing 110. The inner casing 120 is the same as the outer casing 110 in size and shape. The inner casing 120 is engaged with the outer casing 110. The outer casing 110 is transparent. The inner casing 120 is opaque. A side of the outer casing 110 facing away from the inner casing 120 is an outer surface of the casing 100. A side of the inner casing 120 facing away from the outer casing 110 is an inner surface of the casing. The casing 100 defines a first through hole 130. The first through hole 130 extends through the outer surface and the inner surface. The first through hole 130 corresponds to the flashlight assembly, so that the light emitted by the flashlight 410 can pass through the first through hole 130 and reach the surroundings of the terminal. The inner casing 120 defines a second through hole 140 and a third through hole 150. Both of the second through hole 140 and the third through hole 150 extend through the inner casing 120. The second through hole 140 faces the first incident face 511. The third through hole 150 faces the second incident face 521. The outer casing 110 is transparent, so that light outside the terminal 1 can reach and pass through the first incident face 511 and the second incident face 521.

As illustrated in FIG. 2 to FIG. 5, in an implementation, the casing 100 has a transparent area 104 and an opaque area 102. Light can pass through the transparent area 104 from the outer surface and reach the inner surface. The transparent area 104 is in the outer casing 110. The opaque area 102 is in the inner casing 120. The transparent area 104 includes parts of the outer casing 110 facing the second through hole 140 and the third through hole 150, respectively. It can be understood that parts of the casing 100 respectively facing the flashlight 410, the first incident face 511, and the second incident face 521 define the transparent area 104. Parts of the casing 100 other than the transparent area 104 is the opaque area 102. It can be understood that the transparent area 104 has an outermost side flush with the outer surface.

As illustrated in FIG. 2 to FIG. 5, in an implementation, the flashlight assembly includes the flashlight 410, a flash lens 420, and a decorative ring 430. The flashlight 410 is disposed between the display screen 200 and the inner casing 120. The flash lens 420 has a T-shaped cross section and covers the first through hole 130. The flash lens 420 includes a first lateral portion 421 and a first longitudinal portion 422 perpendicular to the first lateral portion 421. The first lateral portion 421 and the first longitudinal portion 422 are both in a cylindrical shape. The first lateral portion 421 has a larger diameter than the first longitudinal portion 422, the first lateral portion 421 is disposed in the terminal 1, and the first longitudinal portion 422 has an end portion extending through the first through hole 130, so that the flash lens 420 can be prevented from falling off from the terminal 1. The decorative ring 430 is hollow. The decorative ring 430 is coupled to the flash lens 420 and the casing 100. The decorative ring 430 is engaged with the first longitudinal portion 422 of the flash lens 420, and the first longitudinal portion 422 can extend through the decorative ring 430. The decorative ring 430 includes a second lateral portion 431 and a second longitudinal portion 432 perpendicular to the second lateral portion 431. The second lateral portion 431 and the second longitudinal portion 432 are both in a circular ring shape. The second lateral portion 431 has an outermost end having a larger diameter than an outermost end of the second longitudinal portion 432. The second lateral portion 431 is disposed between the first lateral portion 421 and the inner casing 120. The second lateral portion 431 is sleeved on the first longitudinal portion 422. The second longitudinal portion 432 passes through the first through hole 130. The longitudinal portion 432 is sleeved on the first longitudinal portion 422. The second longitudinal portion 432 extends out of the outer surface, that is, the second longitudinal portion 432 extends out of the transparent area 104. A part of the second longitudinal part 432 extending out of the outer surface is longer than that of the first longitudinal portion 422 extending out of the outer surface. A height difference is defined between the second longitudinal portion 432 and the transparent area 104. The height difference ranges from 0.1 mm to 1.0 mm. It can be understood that the first longitudinal portion 422 is flush with the outer surface or extends out of the outer surface with a small part. The second longitudinal portion 432 extends out of the outer surface, that is, the second longitudinal portion 432 extends out of the transparent area 104. When the terminal 1 is placed on a flat surface, the second longitudinal portion 432 is in contact with the flat surface, preventing the outer surface of the casing 100 from being in contact with the flat surface. In this way, the transparent area 104 is prevented from being in contact with the flat surface, so that the transparent area 104 is prevented from abrasion, light can reach and pass through the first incident face 511 and the second incident face 521, and the flashlight 410 can emit light outside. It can be understood that the second longitudinal portion 432 extends out of the outer surface, so that the transparent area 104 is protected and the outer surface is prevented from abrasion.

Figure 6:
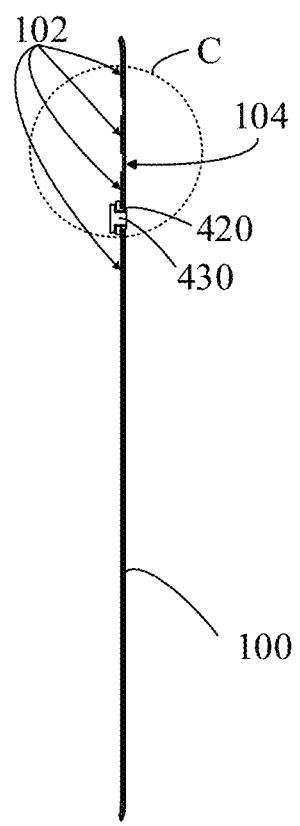
FIG. 6 is a schematic view of a casing assembly of the terminal illustrated in FIG. 4.
Figure 7:
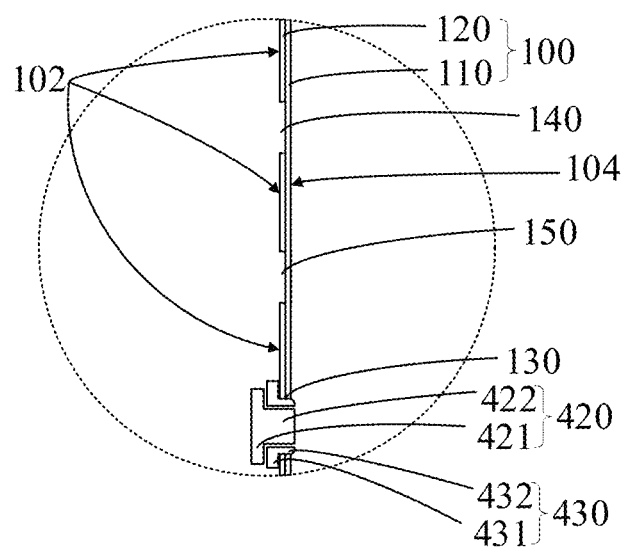
FIG. 7 is an enlarged view of a portion C illustrated in FIG. 6.

As illustrated in FIG. 6 and FIG. 7, in an implementation, a casing assembly is provided. The casing assembly includes the casing 100, the flash lens 420, and the decorative ring 430. The casing 100 includes the outer casing 110 and the inner casing 120. The outer casing 110 is transparent. The inner casing 120 is opaque. The outer casing 110 is engaged with the inner casing 120. The transparent area 104 is in the outer casing 110. The opaque area 102 is in the inner casing 120. The outer surface of the casing 100 is the side of the outer casing 110 facing away from the inner casing 120. The inner surface of the casing 100 is the side of the inner casing 120 facing away from the outer casing 110. The casing 100 defines the first through hole 130. The first through hole 130 extends through the outer casing 110 and the inner casing 120. The inner casing 120 defines the second through hole 140 and the third through hole 150. The transparent area 104 includes parts of the outer casing 110 facing the second through hole 140 and the third through hole 150, respectively. Light can pass through the transparent area 104 from the outer surface and reach the inner surface of the casing 100. Parts of the casing 100 other than the transparent area is an opaque area.

In an implementation, the casing assembly further includes the flash lens 420 and the decorative ring 430. The flash lens 420 has the T-shaped cross section and covers the first through hole 130. The flash lens 420 includes the first lateral portion 421 and the first longitudinal portion 422 perpendicular to the first lateral portion 421. The first lateral portion 421 and the first longitudinal portion 422 are both in a cylindrical shape. The first lateral portion 421 has a larger diameter than the first longitudinal portion 422, the first lateral portion 421 is disposed in the terminal 1, and the first longitudinal portion 422 has the end portion extending through the first through hole 130, so that the flash lens 420 can be prevented from falling off from the terminal 1. The decorative ring 430 is hollow. The decorative ring 430 is coupled to the flash lens 420 and the casing 100. The decorative ring 430 is engaged with the first longitudinal portion 422 of the flash lens 420, and the first longitudinal portion 422 can extend through the decorative ring 430. The decorative ring 430 includes the second lateral portion 431 and the second longitudinal portion 432 perpendicular to the second lateral portion 431. The second lateral portion 431 and the second longitudinal portion 432 are both in a circular ring shape. The second lateral portion 431 has the outermost end having a larger diameter than the outermost end of the second longitudinal portion 432. The second lateral portion 431 is disposed between the first lateral portion 421 and the inner casing 120. The second lateral portion 431 is sleeved on the first longitudinal portion 422. The second longitudinal portion 432 passes through the first through hole 130. The second longitudinal portion 432 is sleeved on the first longitudinal portion 422. The second longitudinal portion 432 extends out of the outer surface, that is, the second longitudinal portion 432 extends out of the transparent area 104. The part of the second longitudinal part 432 extending out of the outer surface is longer than that of the first longitudinal portion 422 extending out of the outer surface. A height difference is defined between the second longitudinal portion 432 and the transparent area 104. The height difference ranges from 0.1 mm to 1.0 mm. It can be understood that the first longitudinal portion 422 is flush with the outer surface or extends out of the outer surface with a small part. The second longitudinal portion 432 extends out of the outer surface, that is, the second longitudinal portion 432 extends out of the transparent area 104. When the terminal 1 is placed on a flat surface, the second longitudinal portion 432 is in contact with the flat surface, preventing the outer surface of the casing 100 from being in contact with the flat surface. In this way, the transparent area 104 is prevented from being in contact with the flat surface, so that the transparent area 104 is prevented from abrasion, light can reach and pass through the first incident face 511 and the second incident face 521, and the flashlight 410 can emit light outside. It can be understood that the second longitudinal portion 432 extends out of the outer surface, so that the transparent area 104 is protected and the outer surface is prevented from abrasion.

With respect to the terminal, the decorative ring 430 of the flashlight assembly extends out of the outer surface of the casing 100, that is, the decorative ring 430 extends out of the transparent area 104 of the casing 100. In this way, the outer surface of the casing 100 has anti-abrasion, such that the transparent area 104 is prevented from abrasion, and accordingly a shooting function of the first camera assembly 510 and the second camera assembly 520 and usage of the flashlight 410 are not affected. By means of the decorative ring 430, the outer surface of the casing 100 has anti-abrasion, so that the casing 100 does not need to define an additional hole to have an anti-abrasion position. Therefore, the components on the casing 100 can be disposed compactly.

The technical features of the above-mentioned implementations can be arbitrarily combined. In order to make the description brief, not all possible combinations of the respective technical features in the above-mentioned implementations are illustrated. As long as there is no contradiction in the combination of these technical features, the combination should be considered within the scope of present disclosure.

Although explanatory implementations have been shown and described, it would be appreciated by those skilled in the art that the above implementations cannot be construed to limit the present disclosure, and changes, alternatives, and modifications can be made in the implementations without departing from spirit, principles and scope of the present disclosure. Therefore, the scope of the present disclosure should be subject to the appended claims.

What is claimed is:

1. A casing assembly, comprising:
    a casing, having an outer surface and an inner surface opposite the outer surface, the casing defining a first through hole, the first through hole extending through the outer surface and the inner surface;
    a flash lens, covering the first through hole; and
    a decorative ring, passing through the first through hole and coupled to the flash lens and the casing, the decorative ring extending out of the outer surface;
    wherein the flash lens has a T-shaped cross-section comprising a first longitudinal portion corresponding to a base of the T-shaped cross-section of the flash lens and a first lateral portion extending from the base of the T-shaped cross section of the flash lens, and the first longitudinal portion extends through the first through hole; and
    wherein the decorative ring has a T-shaped cross-section comprising a second longitudinal portion corresponding to a base of the T-shaped cross-section of the decorative ring and a second lateral portion extending from the base of the T-shaped cross-section of the decorative ring, and the decorative ring is coupled to the flash lens by disposing the second lateral portion between the first lateral portion and the inner surface and by disposing the second longitudinal portion to sleeve on the first longitudinal portion;
    wherein the second longitudinal portion is disposed between the casing and the first longitudinal portion;

wherein the casing comprises an outer casing and an inner casing engaged with the outer casing;

the casing has a transparent area and an opaque area, wherein the opaque area is in the inner casing and the transparent area is in the outer casing, and the transparent area enables light to pass through the outer surface and reach the inner surface; and the decorative ring has a portion extending out of the outer surface.

2. The casing assembly of claim 1, wherein a height difference between the portion and the transparent area ranges from 0.1 mm to 1.0 mm.

3. The casing assembly of claim 1, wherein:

the outer surface is a side of the outer casing facing away from the inner casing; and the inner surface is a side of the inner casing facing away from the outer casing.

4. The casing assembly of claim 3, wherein:

the inner casing defines a second through hole and a third through hole; and the transparent area comprises parts of the outer casing facing the second through hole and the third through hole, respectively.

5. The casing assembly of claim 1, wherein:

the first longitudinal portion is perpendicular to the first lateral portion.

6. The casing assembly of claim 5, wherein:

the second longitudinal portion is perpendicular to the second lateral portion, wherein the second lateral portion and the second longitudinal portion are both sleeved on the first longitudinal portion.

7. The casing assembly of claim 6, wherein a part of the second longitudinal extending out of the outer surface is longer than that of the first longitudinal portion extending out of the outer surface.

8. The casing assembly of claim 6, wherein:

the first lateral portion and the first longitudinal portion are both in a cylindrical shape; and the second lateral portion and the second longitudinal portion are both in a circular ring shape.

9. A terminal, comprising:

a display screen;

a casing, having an outer surface and an inner surface opposite the outer surface, the inner surface being a side of the casing facing the display screen, the outer surface being a side of the casing facing away from the display screen, the casing defining a first through hole, and the first through hole extending through the outer surface and the inner surface;

a flashlight, disposed between the display screen and the casing;

a flash lens, disposed adjacent to a side of the flashlight facing the casing, the flash lens covering the first through hole; and a decorative ring, passing through the first through hole and coupled to the flash lens and the casing, the decorative ring extending out of the outer surface;

wherein the flash lens has a T-shaped cross-section comprising a first longitudinal portion corresponding to a base of the T-shaped cross-section of the flash lens and a first lateral portion extending from the base of the T-shaped cross section of the flash lens, and the first longitudinal portion extends through the first through hole; and wherein the decorative ring has a T-shaped cross-section comprising a second longitudinal portion corresponding to a base of the T-shaped cross-section of the decorative ring and a second lateral portion extending from the base of the T-shaped cross-section of the decorative ring, and the decorative ring is coupled to the flash lens by disposing the second lateral portion between the first lateral portion and the inner surface and by disposing the second longitudinal portion to sleeve on the first longitudinal portion;

wherein the second longitudinal portion is disposed between the inner surface and the first longitudinal portion, wherein the casing comprises an outer casing and an inner casing engaged with the outer casing;

the casing has a transparent area and an opaque area, wherein the opaque area is in the inner casing and the transparent area is in the outer casing, and the transparent area enables light to pass through the outer surface and reach the inner surface; and the decorative ring has a portion extending out of the outer surface.

10. The terminal of claim 9, wherein a height difference between the portion and the transparent area ranges from 0.1 mm to 1.0 mm.

11. The terminal of claim 9, wherein:

the outer surface is a side of the outer casing facing away from the inner casing; and the inner surface is a side of the inner casing facing away from the outer casing.

12. The terminal of claim 11, wherein:

the inner casing defines a second through hole and a third through hole; and the transparent area comprises parts of the outer casing facing the second through hole and the third through hole, respectively.

13. The terminal of claim 12, wherein:

the terminal comprises a first camera assembly and a second camera assembly, wherein the first camera assembly has a first incident face, and the second camera assembly has a second incident face;

the transparent area enables light to pass through the second through hole and reach the first incident face; and the transparent area further enables light to pass through the third through hole and reach the second incident face.

14. The terminal of claim 9, wherein:

the first longitudinal portion is perpendicular to the first lateral portion.

15. The terminal of claim 14, wherein:

the second longitudinal portion is perpendicular to the second lateral portion, wherein the second lateral portion and the second longitudinal portion are both sleeved on the first longitudinal portion.

16. The terminal of claim 15, wherein a part of the second longitudinal extending out of the outer surface is longer than that of the first longitudinal portion extending out of the outer surface.

17. The terminal of claim 15, wherein:

the first lateral portion and the first longitudinal portion are both in a cylindrical shape; and the second lateral portion and the second longitudinal portion are both in a circular ring shape.

18. A terminal, comprising:

a casing, defining a through hole extending through the casing;

a flash lens, disposed in the through hole; and a decorative ring, disposed in the through hole and sleeved on the flash lens;

wherein the flash lens has a T-shaped cross-section comprising a first longitudinal portion corresponding to a base of the T-shaped cross-section of the flash lens and a first lateral portion extending from the base of the T-shaped cross section of the flash lens, and the first longitudinal portion extends through the through hole, and wherein the decorative ring has a T-shaped cross-section comprising a second longitudinal portion corresponding to a base of the T-shaped cross-section of the decorative ring and a second lateral portion extending from the base of the T-shaped cross-section of the decorative ring, and the decorative ring is coupled to the flash lens by disposing the second lateral portion between the first lateral portion and an inner surface of the casing and by disposing the second longitudinal portion to sleeve on the first longitudinal portion;

wherein the second longitudinal portion is disposed between the casing and the first longitudinal portion, wherein the casing comprises an outer casing and an inner casing engaged with the outer casing;

the casing has a transparent area and an opaque area, wherein the opaque area is in the inner casing and the transparent area is in the outer casing, and the transparent area enables light to pass through an outer surface of the casing and reach the inner surface; and the decorative ring has a portion extending out of the outer surface.

\* \* \* \* \*